United States Patent [19]

Clifford

[11] Patent Number: 5,752,170
[45] Date of Patent: May 12, 1998

[54] TRANSMITTERS FOR RADIO TELEPHONE BASE STATIONS

[75] Inventor: Paul Thomas Clifford, Fleet, Great Britain

[73] Assignee: Nokia Mobile Phones Limited, Espoo, Finland

[21] Appl. No.: 628,630

[22] PCT Filed: Oct. 12, 1995

[86] PCT No.: PCT/GB95/02409

§ 371 Date: Jul. 19, 1996

§ 102(e) Date: Jul. 19, 1996

[87] PCT Pub. No.: WO96/12343

PCT Pub. Date: Apr. 25, 1996

[30] Foreign Application Priority Data

Oct. 15, 1994 [GB] United Kingdom ............... 9420843

[51] Int. Cl.$^6$ .................................................. H01Q 11/12
[52] U.S. Cl. ................................... 455/126; 455/115
[58] Field of Search ............................. 455/126, 115, 455/116, 103; 330/129

[56] References Cited

U.S. PATENT DOCUMENTS 5,125,100  6/1992  Katznelson ................. 455/126 X
5,524,285  6/1996  Wray et al. ................... 455/126

FOREIGN PATENT DOCUMENTS

WO 88/03342  5/1988  WIPO .
WO 93/21700  10/1993  WIPO .

*Primary Examiner*—Thomas Mullen
*Attorney, Agent, or Firm*—Perman & Green, LLP

[57] ABSTRACT

A multi-channel transmitter has a variable gain preamplifier (8a, 8b, 8c) for each channel, the combined outputs being fed to a linearized multi-channel power amplifier (10). The output of the latter is sampled by coupling means (12) which produce a sampled signal representative of the power in each channel. The sampled signal is applied to a frequency selective feedback loop which, for each channel, provides a control signal (20a, 20b, 20c) applied to the corresponding preamplifier (8a, 8b, 8c) to vary the gain of the latter in order to provide separate power control for each channel.

5 Claims, 1 Drawing Sheet

TRANSMITTERS FOR RADIO TELEPHONE BASE STATIONS

BACKGROUND OF THE INVENTION

This invention relates to transmitters for radio telephone base stations, particularly base stations for digital cellular systems such as those operating according to the standard known as GSM.

This invention is concerned with power control of a plurality of radio channels in a single transmitter. Conventional power control loops are not frequency selective and are therefore not suitable for controlling the power output of a number of channels in a single transmitter.

SUMMARY OF THE INVENTION

According to the invention there is provided a transmitter for a radio telephone base station, the transmitter being operative to transmit radio signals on at least two channels, the transmitter comprising a variable gain preamplifier for each channel, combining means for combining the outputs of the variable gain preamplifiers, a multichannel power amplifier for amplifying the output of the combining means, coupling means for sampling the output of the multi-channel power amplifier and for obtaining a sampled signal representative of the output power on each channel, and a feedback loop for applying to each variable gain preamplifier a control signal which is derived from the said sampled signal, whereby the gain of each preamplifier is varied in dependence upon the power level of each channel at the output of the multichannel power amplifier.

Hence, by recourse to the invention a novel control loop is applied around the multichannel power amplifier.

BRIEF DESCRIPTION OF THE DRAWING

A transmitter according to the invention will now be described, by way of example, with reference to the accompanying drawing which is a block circuit diagram of the transmitter.

DETAILED DESCRIPTION OF THE PREFERRED EMBODIMENT

Figure 1:
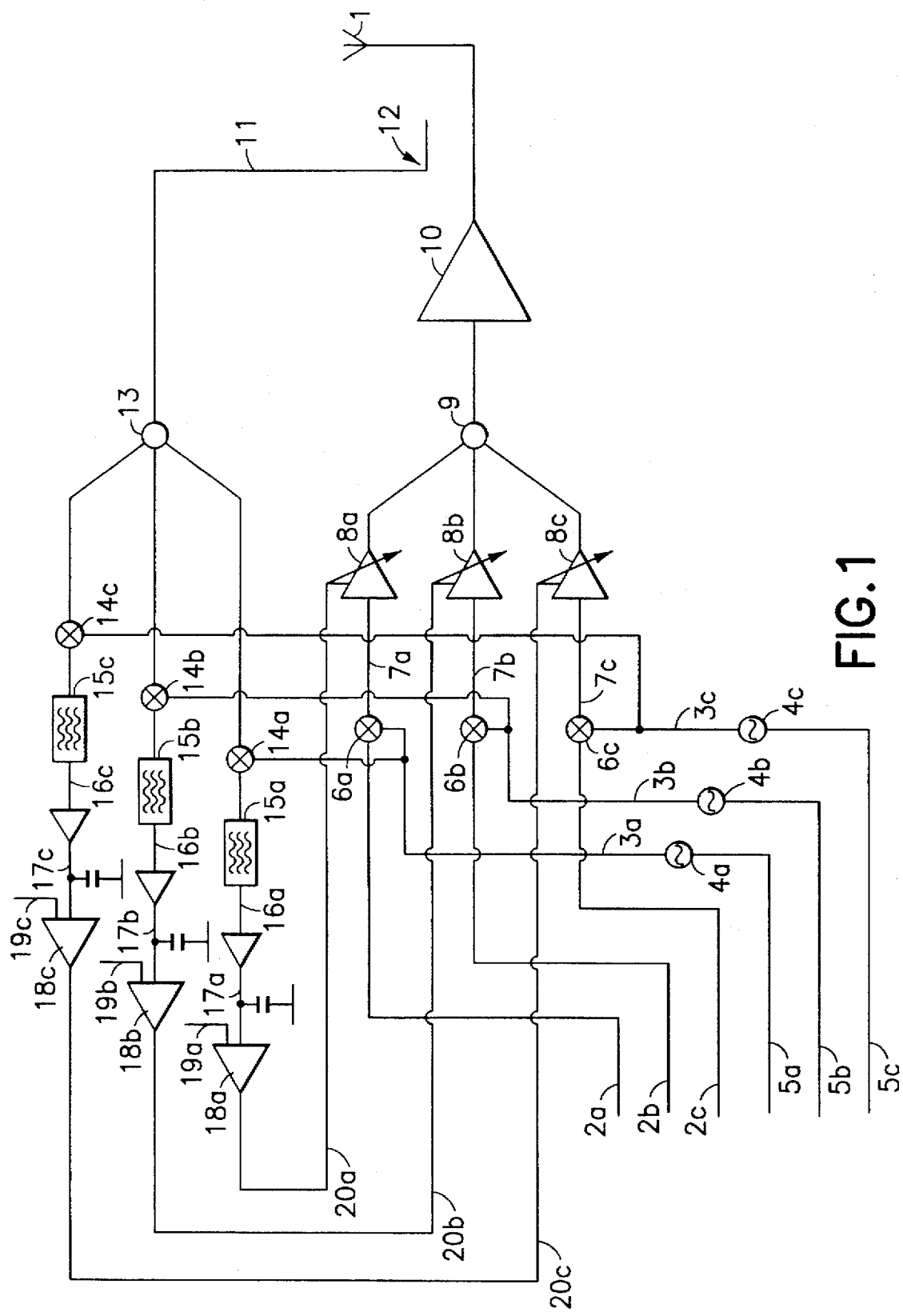

Referring to the drawings the transmitter forms part of a base station in a radio telephone system, such as a digital cellular system, eg one operating according to the GSM standard. The base station communicates with portable handsets, and the transmitted output is radiated from an antenna 1.

The transmitter has three channels and the information to be transmitted is carried on respective baseband signals 2a, 2b, 2c at 67 KHz. In this example, the information is carried by a modulation system known as Gaussian Minimum Shift Keying, but other modulation systems may be used. To the three base band signals are added respective high frequency signals 3a, 3b, 3c (at 1.85 GHz) derived from corresponding voltage controlled oscillators 4a, 4b, 4c supplied with respective control voltages 5a, 5b, 5c. This addition is carried out in three single side band up-converters 6a, 6b, 6c, one for each channel. The composite output signal 7a, 7b, 7c from each up-converter is fed as one input to a corresponding one of three variable gain preamplifiers 8a, 8b, 8c, the outputs of which are combined in a three-way power combiner 9 and fed to a linearised multi-channel power amplifier 10.

The output of the power amplifier 10 is fed to the antenna 1 for transmission. This output includes components on the three channels and it is sampled by a coupling element 12 which, by inductive coupling, samples a small part of the output power of each channel. Hence, the coupling element 12 obtains a sampled signal 11 representative of the output power on each channel. This sampled signal 11 is split into three equal power components in a power splitter 13, the individual components (each of which is representative of the output power on all channels) being fed to respective power control receivers 14a, 14b, 14c to which are also fed the high frequency voltages 3a, 3b, 3c applied to the respective up-converters. In each power control receiver 14a, 14b, 14c, the high frequency voltage from the corresponding voltage controlled oscillator is subtracted from the composite signal to leave the base band signal for the corresponding channel, together with the composite signal for the other two channels.

The output of each power control receiver 14a, 14b, 14c is fed to a corresponding intermediate frequency filter 15a, 15b, 15c which removes the unwanted signals of the other two channels and filters out other unwanted components. The resulting baseband signals 16a, 16b, 16c are fed through corresponding baseband demodulators 17a, 17b, 17c and applied as one input to an error amplifier 18a, 18b, 18c, the other input of which is a power control signal 19a, 19b, 19c. Each error amplifier 18a, 18b, 18c produces an output signal which is representative of the difference between its inputs and which constitutes a control signal 20a, 20b, 20c which is applied to the corresponding variable gain preamplifier 8a, 8b, 8c to alter its gain. Hence, the gain of each preamplifier 8a, 8b, 8c is continuously varied in dependence upon the output power of the multichannel power amplifier 10 for that channel, so that adaptive power control is used on each channel separately, using frequency selectivity. The closed loop power control system controls (with 2 dB power stepping) the plurality of radio channels being amplified.

The three channels are preferably channels operating according to the same standard or system, but the invention is applicable to channels of different systems. For example, the channel bearing the "a" suffices could be GSM operating at 900 MHz, and the two other channels could be on a digital cellular system operating at 1.8 Giga Hz.

What is claimed is:

1. A transmitter for a radio telephone base station, the transmitter being operative to transmit radio signals on at least two channels, the transmitter comprising a variable gain preamplifier for each channel, combining means for combining the outputs of the variable gain preamplifiers, a multichannel power amplifier for amplifying the output of the combining means, coupling means for sampling the output of the multi-channel power amplifier and for obtaining a sampled signal representative of the output power on each channel, and a feedback loop for applying to each variable gain preamplifier a control signal which is derived from the said sampled signal, whereby the gain of each preamplifier is varied in dependence upon the power level of each channel at the output of the multichannel power amplifier.

2. A transmitter according to claim 1 and including, for each channel, a mixer in which a baseband signal carrying the information of that channel is added to a high frequency control signal to provide a composite signal which is fed as an input to the corresponding preamplifier, whereby the sampled signal includes baseband and high frequency components for each channel.

3. A transmitter according to claim 2, wherein the feedback loop includes means for subtracting the high frequency control signal from the sampled signal to provide, for each channel, a baseband signal.

4. A transmitter according to claim 3, wherein said means are electrically connected to the inputs of the mixers so that the high frequency control voltage is derived from the input to the mixers.

5. A transmitter according to claim 3 or 4, where the feedback loop includes, for each channel, an error amplifier the respective inputs of which are the baseband signal and a power control signal and the output of which is the control signal applied to the corresponding preamplifier.

* * * * *

UNITED STATES PATENT AND TRADEMARK OFFICE
CERTIFICATE OF CORRECTION

PATENT NO. : 5,752,170
DATED : May 12, 1998
INVENTOR(S) : Clifford

It is certified that error appears in the above-identified patent and that said Letters Patent is hereby corrected as shown below:

```
On the title page: Item [73] Assignee: should read -- NOKIA
TELECOMMUNICATIONS OY --.
```

Signed and Sealed this

Twenty-third Day of March, 1999

Attest:

Attesting Officer

Q. TODD DICKINSON

Acting Commissioner of Patents and Trademarks